(12) United States Patent
Wang et al.

(10) Patent No.: US 10,720,118 B2
(45) Date of Patent: Jul. 21, 2020

(54) SHIFT REGISTER AND DRIVING METHOD THEREOF, AND GATE DRIVING CIRCUIT

(71) Applicants: BOE Technology Group Co., Ltd., Beijing (CN); HEFEI BOE OPTOELECTRONICS TECHNOLOGY CO., LTD., Anhui (CN)

(72) Inventors: Ying Wang, Beijing (CN); Meng Li, Beijing (CN); Xun Pu, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 180 days.

(21) Appl. No.: 16/008,698

(22) Filed: Jun. 14, 2018

(65) Prior Publication Data
US 2019/0206352 A1 Jul. 4, 2019

(30) Foreign Application Priority Data
Jan. 2, 2018 (CN) .......................... 2018 1 0003016

(51) Int. Cl.
*G11C 19/00* (2006.01)
*G09G 3/36* (2006.01)
(Continued)

(52) U.S. Cl.
CPC ......... *G09G 3/3677* (2013.01); *G11C 19/184* (2013.01); *G11C 19/28* (2013.01);
(Continued)

(58) Field of Classification Search
None
See application file for complete search history.

(56) References Cited

U.S. PATENT DOCUMENTS

2015/0036784 A1* 2/2015 Qing .................... G11C 19/184
377/68
2017/0004775 A1* 1/2017 Chen .................... G09G 3/3266
(Continued)

*Primary Examiner* — Tuan T Lam
(74) *Attorney, Agent, or Firm* — Westman, Champlin & Koehler, P.A.

(57) ABSTRACT

Embodiments of the present disclosure provide a shift register and a driving method thereof and a gate driving circuit. The shift register comprises an inputting circuit, a first outputting circuit, and a second outputting circuit. The first outputting circuit may comprise a first pulling-up sub-circuit, a first outputting sub-circuit, a first pulling-down sub-circuit, and a switching sub-circuit. A controlling terminal of switching sub-circuit is coupled to a controlling terminal of the first pulling-up sub-circuit. An inputting terminal of the switching sub-circuit is coupled to the outputting terminal of a first outputting sub-circuit. The second outputting circuit may comprise a second pulling-up sub-circuit, a second outputting sub-circuit, and a second pulling-down sub-circuit. An inputting terminal of the second pulling-up sub-circuit is coupled to an outputting terminal of the switching sub-circuit. A controlling terminal of the second outputting sub-circuit is coupled to an outputting terminal of the second pulling-up sub-circuit.

9 Claims, 5 Drawing Sheets

(51) Int. Cl.
    *G11C 19/28*    (2006.01)
    *G11C 19/18*    (2006.01)
(52) U.S. Cl.
    CPC . *G09G 2310/0286* (2013.01); *G09G 2310/06* (2013.01); *G09G 2310/08* (2013.01)

(56) References Cited

U.S. PATENT DOCUMENTS

| | | | |
|---|---|---|---|
| 2017/0069286 A1* | 3/2017 | Wu | G09G 3/20 |
| 2017/0116920 A1* | 4/2017 | Kwon | G09G 3/3266 |
| 2018/0151122 A1* | 5/2018 | Ding | G06K 9/00993 |
| 2018/0190231 A1* | 7/2018 | Shi | G09G 3/3655 |
| 2018/0301100 A1* | 10/2018 | Li | G09G 3/3674 |
| 2019/0066596 A1* | 2/2019 | Xue | G09G 3/3266 |
| 2019/0139475 A1* | 5/2019 | Wang | G11C 7/02 |
| 2019/0164498 A1* | 5/2019 | Jang | G09G 3/3266 |

\* cited by examiner

SHIFT REGISTER AND DRIVING METHOD THEREOF, AND GATE DRIVING CIRCUIT

CROSS-REFERENCE TO RELATED APPLICATION(S)

This application claims the priority of Chinese Patent Application No. 201810003016.6 filed on Jan. 2, 2018, the disclosure of which is incorporated herein by reference in its entirety as part of this application.

TECHNICAL FIELD

Embodiments of the present disclosure relate to the field of display technology, and in particular, to a shift register and a driving method thereof, and a gate driving circuit.

BACKGROUND

Thin film transistor-liquid crystal displays (TFT-LCD) are operated by sequentially inputting a square wave with a certain width to each row of pixels through a gate, and then sequentially driving data signal for each row of pixels via a source.

However, a shift register in each stage of a gate driving circuit generates a shift register signal in response to a trigger signal. The shift register in each stage can only be used to drive one row of gate line. Thus, the entire area occupied by the gate driving circuit is larger, which does not facilitating in narrowing bezels of the displays.

SUMMARY

According to an aspect of the disclosure, there is provided a shift register, comprising:
an inputting circuit;
a first outputting circuit, comprising a first pulling-up sub-circuit, a first outputting sub-circuit, a first pulling-down sub-circuit, and a switching sub-circuit; wherein an outputting terminal of the inputting circuit is electrically coupled to a controlling terminal of the first pulling-up sub-circuit, an outputting terminal of the first pulling-up sub-circuit is electrically coupled to a controlling terminal of the switching sub-circuit and a controlling terminal of the first outputting sub-circuit; an inputting terminal of the switching sub-circuit is electrically coupled to an outputting terminal of the first outputting sub-circuit; and an outputting terminal of the first pulling-down sub-circuit is electrically coupled to the outputting terminal of the first outputting sub-circuit; and
a second outputting circuit, comprising a second pulling-up sub-circuit, a second outputting sub-circuit, and a second pulling-down sub-circuit; wherein an inputting terminal of the second pulling-up sub-circuit is electrically coupled to an outputting terminal of the switching sub-circuit, a controlling terminal of the second outputting sub-circuit is electrically coupled to an outputting terminal of the second pulling-up sub-circuit, and an outputting terminal of the second outputting sub-circuit is electrically coupled to an outputting terminal of the second pulling-down sub-circuit.

For example, a controlling terminal of the inputting circuit is electrically coupled to a first clock signal terminal, and an inputting terminal of the inputting circuit is electrically coupled to an STV signal inputting terminal, and
wherein an inputting terminal of the first pulling-up sub-circuit is electrically coupled to a second clock signal terminal;
wherein a controlling terminal of the first pulling-down sub-circuit is electrically coupled to a third clock signal terminal;
wherein a controlling terminal of the second pulling-up sub-circuit is electrically coupled to the third clock signal terminal; and
wherein a controlling terminal of the second pulling-down sub-circuit is electrically coupled to the first clock signal terminal.

For another example, the inputting circuit comprises a first switch transistor and a second switch transistor, wherein the first switch transistor has a first electrode electrically coupled to the STV signal inputting terminal and a second electrode electrically coupled to a first electrode of the second switch transistor; the second switch transistor has a second electrode electrically coupled to the controlling terminal of the first pulling-up sub-circuit, the controlling terminal of the switching sub-circuit and the controlling terminal of the first outputting sub-circuit; and both of the first switch transistor and the second switch transistor have a gate electrically coupled to the first clock signal terminal; and
a leakage limiting transistor, wherein the leakage limiting transistor has a gate electrically coupled to the controlling terminal of the first pulling-up sub-circuit, a first electrode electrically coupled to the second electrode of the first switch transistor, and a second electrode electrically coupled to the second clock signal terminal.

For another example, the first pulling-down sub-circuit comprises a third switch transistor and a fourth switch transistor, wherein both of the third switch transistor and the fourth switch transistor have a gate controlled by the third clock signal terminal; and
the third switch transistor has a first electrode electrically coupled to the gate of the leakage limiting transistor and a second electrode electrically coupled to a first electrode of the fourth switch transistor, and the fourth switch transistor has a second electrode electrically coupled to a low level power supplying terminal.

For another example, the first pulling-down sub-circuit comprises a fifth switch transistor; and
wherein the fifth switch transistor has a first electrode electrically coupled to the low level power supplying terminal, a second electrode electrically coupled to the controlling terminal of the first pulling-up sub-circuit, and a gate electrically coupled to the third clock signal terminal.

For another example, the second pulling-down sub-circuit comprises a sixth switch transistor and a seventh switch transistor; and
wherein both of the sixth switch transistor and the seventh transistor have a gate electrically coupled to the first clock signal terminal, the sixth switch transistor has a first electrode electrically coupled to the inputting terminal of the second pulling-up sub-circuit and a second terminal electrically coupled to a first electrode of the seventh switch transistor, and the seventh switch transistor has a second electrode electrically coupled to the low level power supplying terminal; and
wherein the leakage limiting transistor has a first electrode electrically coupled to the second electrode of the sixth switch transistor.

For another example, the first pulling-up sub-circuit comprises an eighth transistor and a first capacitor, and
wherein the eighth transistor has a gate electrically coupled to the outputting terminal of the inputting circuit, a first electrode electrically coupled to the second clock signal terminal, and a second electrode electrically coupled to a first electrode of the first capacitor, and wherein the first capacitor has a second electrode electrically coupled to the gate of the eighth transistor.

For another example, the second outputting sub-circuit comprises a ninth transistor and a second capacitor; and wherein the ninth transistor has a gate electrically coupled to a first electrode of the second capacitor, a first electrode electrically coupled to a high level power supplying terminal, and a second electrode electrically coupled to a second electrode of the second capacitor.

According to another aspect of the embodiments of the present disclosure, there is provided a gate driving circuit, comprising a plurality of cascaded shift registers, wherein each of the plurality of cascaded shift registers is the shift register according to the embodiments of the present disclosure.

According to yet another aspect of the embodiments of the present disclosure, there is provided a method for driving a shift register of claim 1, comprising:

inputting a first clock signal of high level into the first clock signal terminal, a second clock signal of low level into the second clock signal terminal, a third clock signal of low level into the third clock signal terminal, and an STV signal of high level to the STV signal inputting terminal, so that a high level signal is outputted to the controlling terminal of the first pulling-up sub-circuit from the outputting terminal of the inputting circuit, and a potential of a second outputting signal from the second outputting sub-circuit is pulled-down by the second pulling-down sub-circuit under the control of the first clock signal, during a writing period;

inputting the first clock signal of low level to the first clock signal terminal, the second clock signal of high level to the second clock signal terminal, and the third clock signal of low level to the third clock signal terminal, so that the outputting terminal of the first pulling-up sub-circuit outputs a high level signal, and the first outputting sub-circuit outputs a first outputting signal under the control of the high level signal from the first pulling-up sub-circuit, and the switching sub-circuit receives the first outputting signal and outputs the received first outputting signal to the inputting terminal of the second pulling-up sub-circuit, during a first outputting period; and inputting the first clock signal of low level to the first clock signal terminal, the second clock signal of low level to the second clock signal terminal, and the third clock signal of high level to the third clock signal terminal, so that the outputting terminal of the second pulling-up sub-circuit outputs the first outputting signal, and the second outputting sub-circuit outputs a second outputting signal under the control of the first outputting signal, and the first pulling-down sub-circuit pulls-down the potential of the first outputting signal, during a second outputting period.

BRIEF DESCRIPTION OF THE DRAWINGS

Those and/or additional aspects and advantages of the embodiments of the present disclosure will become apparent and easily understood from the following description of embodiments. It will be apparent that the drawings are only used for illustrating the embodiments and are not to be considered as limiting the present disclosure. Further, like reference numerals refer to like elements throughout the drawings, in which.

DETAILED DESCRIPTION

Specific implementations, structures, features and functions of a shift register and a driving method thereof, a gate driving circuit according to embodiments of the present disclosure will be described below with reference to the accompanying drawings and preferred embodiments, so as to further describe the technical means and functions employed by the present disclosure for achieving the intended purpose. In the following description, different expressions such as "one embodiment" or "an embodiment" does not necessarily mean the same embodiment. In addition, specific features, structures, or characteristics in one or more embodiments may be combined in any suitable form.

The embodiment of the present disclosure provides a shift register having two outputting circuits, i.e. a first outputting circuit and a second outputting circuit. A first outputting sub-circuit and a switching sub-circuit in the first outputting circuit can be turned on at the same time. Thus, while the first outputting sub-circuit outputs a first outputting signal, the switching sub-circuit may output the first outputting signal as an inputting signal for a second pulling-up sub-circuit in the second outputting circuit, so that a two-stage output can be achieved.

Figure 1:
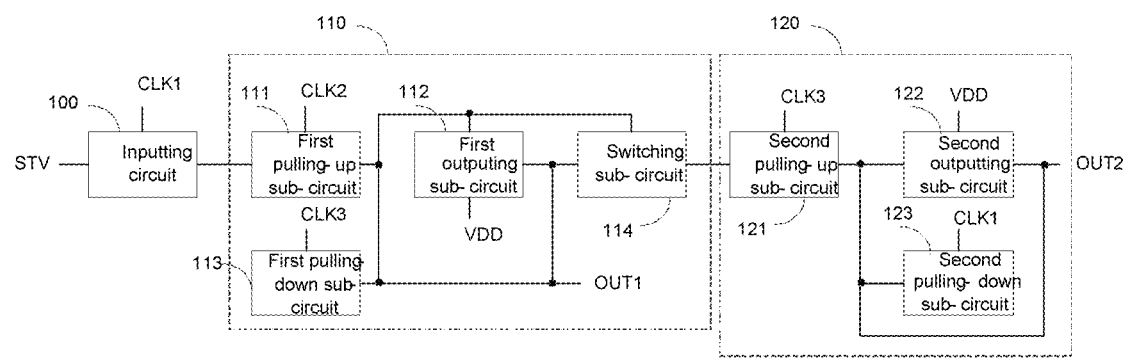
FIG. 1 shows a schematic diagram illustrating a structure of a shift register according to an embodiment of the present disclosure.

FIG. 1 shows one embodiment of a shift register according to the present disclosure. As shown in FIG. 1, the shift register 10 according to the embodiment of the present disclosure may include an inputting circuit 100, a first outputting circuit 110, and a second outputting circuit 120.

The first outputting circuit 110 may comprise a first pulling-up sub-circuit 111, a first outputting sub-circuit 112, a first pulling-down sub-circuit 113, and a switching sub-circuit 114. An outputting terminal of the inputting circuit 100 is electrically coupled to a controlling terminal of the first pulling-up sub-circuit 111. The first pulling-down sub-circuit 113 is configured to pull down the first outputting signal from the first outputting sub-circuit 112. An outputting terminal of the first pulling-up sub-circuit 111 is electrically coupled to a controlling terminal of the switching sub-circuit 114 and a controlling terminal of the first outputting sub-circuit 112. An inputting terminal of the switching sub-circuit 114 is electrically coupled to an outputting terminal of the first outputting sub-circuit 112. The second outputting circuit 120 may comprise a second pulling-up sub-circuit 121, a second outputting sub-circuit 122, and a second pulling-down sub-circuit 123. An inputting terminal of the second pulling-up sub-circuit 121 is electrically coupled to an outputting terminal of the switching sub-circuit 114. A controlling terminal of the second outputting sub-circuit 122 is electrically coupled to an outputting terminal of the second pulling-up sub-circuit 121. An outputting terminal of the second outputting sub-circuit 122 is electrically coupled to an outputting terminal of the second pulling-down sub-circuit 123.

As shown in FIG. 1, the shift register 10 comprises two outputting circuits. The controlling terminal of the first outputting sub-circuit 112 and the controlling terminal of the switching sub-circuit 114 in the first outputting circuit 110 are controlled by the outputting terminal of the first pulling-up sub-circuit 111. The inputting terminal of the switching sub-circuit 114 is electrically coupled to the outputting terminal of the first outputting sub-circuit 112. Therefore, during a first outputting period, the first outputting sub-circuit 112 and the switching sub-circuit 114 can be turned on at the same time. At this time, the first outputting sub-circuit 112 outputs the first outputting signal OUT1, and the switching sub-circuit 114 inputs the first outputting signal OUT1 to the inputting terminal of the second pulling-up sub-circuit 121. The second pulling-up sub-circuit 121 enables the first outputting signal of high level to be input to the second outputting sub-circuit 122, so that the second outputting sub-circuit 122 outputs the second outputting signal OUT2. Thus, a single shift register can generate two outputting signals to drive two gate lines, reducing the number of shift registers in a gate driving circuit significantly and facilitating in reducing the size of the gate driving circuit. This may further facilitate in narrowing a bezel of a display panel.

A controlling terminal of the inputting circuit 100 is electrically coupled to a first clock signal terminal CLK1, and an inputting terminal of the inputting circuit 100 is electrically coupled to an STV signal inputting terminal STV. An inputting terminal of the first pulling-up sub-circuit is electrically coupled to a second clock signal terminal CLK2. A controlling terminal of the first pulling-down sub-circuit 113 is electrically coupled to a third clock signal terminal CLK3. A controlling terminal of the second pulling-up sub-circuit 121 is electrically coupled to the third clock signal terminal CLK3. A controlling terminal of the second pulling-down sub-circuit 123 is electrically coupled to the first clock signal terminal CLK1.

Figure 2:
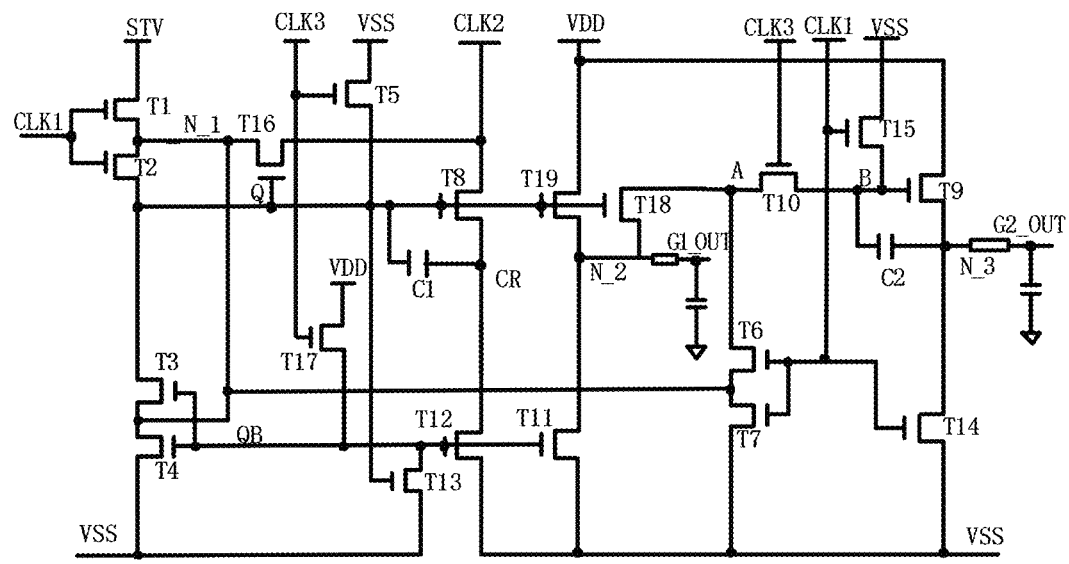
FIG. 2 shows a schematic diagram illustrating a circuit of a shift register according to an embodiment of the present disclosure.

FIG. 2 shows a schematic diagram illustrating a circuit of a shift register according to an embodiment of the present disclosure. As shown in FIG. 2, the inputting circuit may comprise a first switch transistor T1 and a second switch transistor T2. The first switch transistor T1 has a first electrode electrically coupled to the STV signal inputting terminal and a second electrode electrically coupled to a first electrode of the second switch transistor T2. The second switch transistor T2 has a second electrode electrically coupled to the controlling terminal of the first pulling-up sub-circuit. Both of the first switch transistor T1 and the second switch transistor T2 have a gate electrically coupled to the first clock signal terminal CLK1. According to the embodiment of the present disclosure, the inputting circuit may further comprise a leakage limiting transistor T16. The leakage limiting transistor T16 has a gate electrically coupled to the controlling terminal of the first pulling-up sub-circuit, a first electrode electrically coupled to the second electrode of the first switch transistor T1, and a second electrode electrically coupled to the second clock signal terminal CLK2.

For another example, the first pulling-down sub-circuit comprises a third switch transistor T3 and a fourth switch transistor T4. Both of the third switch transistor T3 and the fourth switch transistor T4 have a gate controlled by the third clock signal terminal CLK3 via a transistor T18. The third switch transistor T3 has a first electrode electrically coupled to the controlling terminal of the first pulling-up sub-circuit and the gate of the leakage limiting transistor T16, and a second electrode electrically coupled to a first electrode of the fourth switch transistor T4. The fourth switch transistor T4 has a second electrode electrically coupled to a low level power supplying terminal VSS. The first electrode of the leakage limiting transistor T16 is electrically coupled to the second electrode of the third switch transistor T3.

According to the embodiment of the present disclosure, the first pulling-down sub-circuit may comprise a fifth switch transistor T5. The fifth switch transistor T5 has a first electrode electrically coupled to the low level power supplying terminal VSS, a second electrode electrically coupled to the controlling terminal of the first pulling-up sub-circuit, and a gate electrically coupled to the third clock signal terminal CLK3. The switching sub-circuit may comprise a transistor T17. The transistor T17 has a gate electrically coupled to the gate of the leakage limiting transistor T16, a first electrode electrically coupled to the inputting terminal of the second pulling-up sub-circuit (that is, a first electrode of T10), and a second electrode electrically coupled to the outputting terminal of the first outputting sub-circuit (that is, a second terminal of T19).

In order to further reduce a leakage of the inputting terminal of the second pulling-up sub-circuit, the second pulling-down sub-circuit comprises a sixth switch transistor T6 and a seventh switch transistor T7. Both of the sixth switch transistor T6 and the seventh transistor T7 have a gate electrically coupled to the first clock signal terminal CLK1. The sixth switch transistor T6 has a first electrode electrically coupled to the inputting terminal of the second pulling-up sub-circuit T10 and a second terminal electrically coupled to a first electrode of the seventh switch transistor T7. The seventh switch transistor T7 has a second electrode electrically coupled to the low level power supplying terminal VSS. The first electrode of the leakage limiting transistor T16 is electrically coupled to the second terminal of the sixth switch transistor T6 and the first electrode of the seventh switch transistor T7.

In order to achieve a rapid output of the first outputting sub-circuit to accommodate a display panel with a high frequency, the first pulling-up sub-circuit comprises an eighth transistor T8 and a first capacitor C1. The eighth transistor T8 has first electrode electrically coupled to the second clock signal terminal CLK2 and a second electrode electrically coupled to a first electrode of the first capacitor C1. The first capacitor C1 has a second electrode electrically coupled to the gate of the eighth transistor T8.

In order to achieve a rapid output of the second outputting sub-circuit, the second outputting sub-circuit comprises a ninth transistor T9 and a second capacitor C2. The ninth transistor T9 has a gate electrically coupled to a first electrode of the second capacitor C2, a first electrode electrically coupled to a high level power supplying terminal VDD and a second electrode electrically coupled to a second electrode of the second capacitor C2.

The first pulling-down sub-circuit may further comprise a transistor T18. The transistor T18 has a gate electrically coupled to the third clock signal terminal CLK3, a first electrode electrically coupled to the high-level power supplying terminal VDD, and a second electrode electrically coupled to the gate of the third switch transistor T3 and the gate of the fourth switch transistor T4. When the transistor T18 is turned on, the high level of the high-level power supplying terminal VDD electrically coupled to the first electrode of the transistor T18 will rapidly turn on the third switch transistor T3 and the fourth switch transistor T4, thereby accelerating the discharge of the node Q. The first pulling-down sub-circuit further includes a transistor T11 and a transistor T12. A gate of the transistor T11 and a gate of the transistor T12 are both electrically coupled to the second electrode of the transistor T18. A first electrode of the transistor T11 and a first electrode of the transistor T12 are both coupled to the low-level power supplying terminal VSS. The transistor T11 has a second electrode electrically coupled to the second electrode CR of the eighth transistor T8. The transistor T19 in the first outputting sub-circuit has a first electrode electrically coupled to the high-level power supplying terminal VDD, and a second electrode electrically coupled to the second electrode of the transistor T12. When the transistor T18 is turned on, the high level of the high-level power supplying terminal VDD electrically coupled to the first electrode of the transistor T18 will turn on the transistor T11 and the transistor T12 rapidly, thereby accelerating the discharge of the second electrode CR of the eighth transistor T8 and the second electrode N_2 of the transistor T19. The first pulling-down sub-circuit may further include a transistor T13 having a gate electrically coupled to a gate of the first pulling-up sub-circuit, a first electrode electrically coupled to a second electrode of the transistor T18, and a second electrode electrically coupled to the low-level power supplying terminal VSS.

The second pulling-down sub-circuit may further include a transistor T14 having a gate electrically coupled to the first clock signal terminal CLK1, a first electrode electrically coupled to a second electrode of the ninth transistor T9, and a second electrode electrically coupled to the low-level power supplying terminal VSS.

According to an embodiment of the present disclosure, the voltages of the high-level power supplying terminals VDD coupled to the different transistor may be the same. It should be understood that different high-level voltages can also be used as required. In addition, the high-level power supplying terminal VDD can be understood as a terminal which provides a voltage being greater than a voltage provided by the low-level power supplying terminal VSS. Similarly, the voltages of the low-level power supplying terminals VDD coupled to the different transistor may be the same, and it should be understood that different low-level voltages may also be selected as needed.

Figure 3:
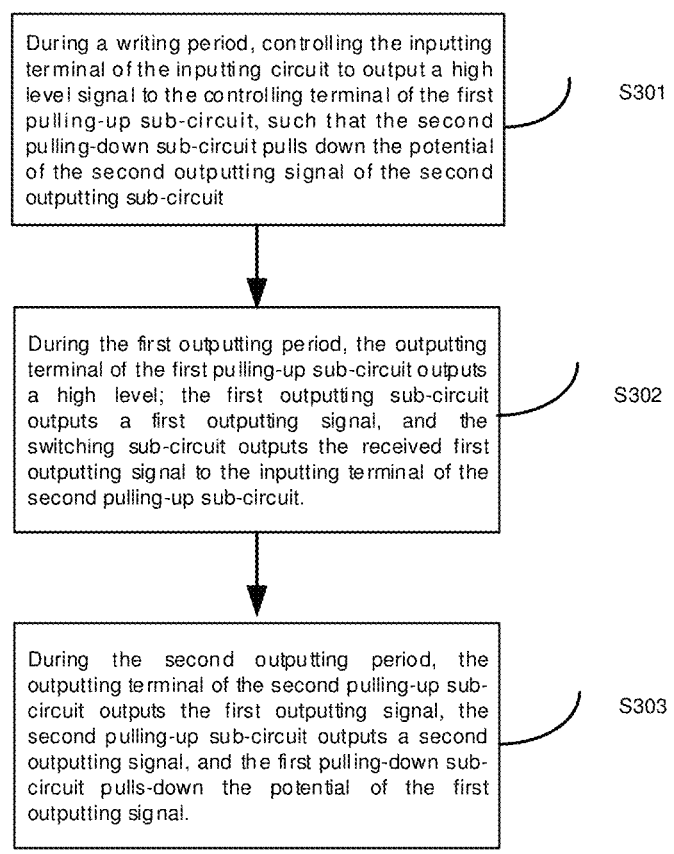
FIG. 3 shows a flowchart illustrating a method for driving the shift register according to an embodiment of the present disclosure.

FIG. 3 shows a flowchart illustrating a method for driving the shift register according to an embodiment of the present disclosure. As shown in FIG. 3, the method for driving a shift register 30 according to an embodiment of the present disclosure may include the following steps:

in step S301, inputting a first clock signal of high level into the first clock signal terminal, a second clock signal of low level into the second clock signal terminal, a third clock signal of low level into the third clock signal terminal, and an STV signal of high level to the STV signal inputting terminal, so that a high level signal is outputted to the controlling terminal of the first pulling-up sub-circuit from the outputting terminal of the inputting circuit, and a potential of a second outputting signal from the second outputting sub-circuit is pulled-down by the second pulling-down sub-circuit under the control of the first clock signal, during a writing period;

in step S302, inputting the first clock signal of low level to the first clock signal terminal, the second clock signal of high level to the second clock signal terminal, and the third clock signal of low level to the third clock signal terminal, so that the outputting terminal of the first pulling-up sub-circuit outputs a high level signal, and the first outputting sub-circuit outputs a first outputting signal under the control of the high level signal from the first pulling-up sub-circuit, and the switching sub-circuit receives the first outputting signal and outputs the received first outputting signal to the inputting terminal of the second pulling-up sub-circuit, during a first outputting period; and in step S303, inputting the first clock signal of low level to the first clock signal terminal, the second clock signal of low level to the second clock signal terminal, and the third clock signal of high level to the third clock signal terminal, so that the outputting terminal of the second pulling-up sub-circuit outputs the first outputting signal, and the second outputting sub-circuit outputs a second outputting signal under the control of the first outputting signal, and the first pulling-down sub-circuit pulls-down the potential of the first outputting signal, during a second outputting period.

In the embodiment of the present disclosure, three clock signal terminals (the first clock signal terminal, the second clock signal terminal, and the third clock signal terminal) are used. With respect to a solution of using two clock signal terminals, the interference among the individual clock signal terminals can be reduced.

Figure 4:
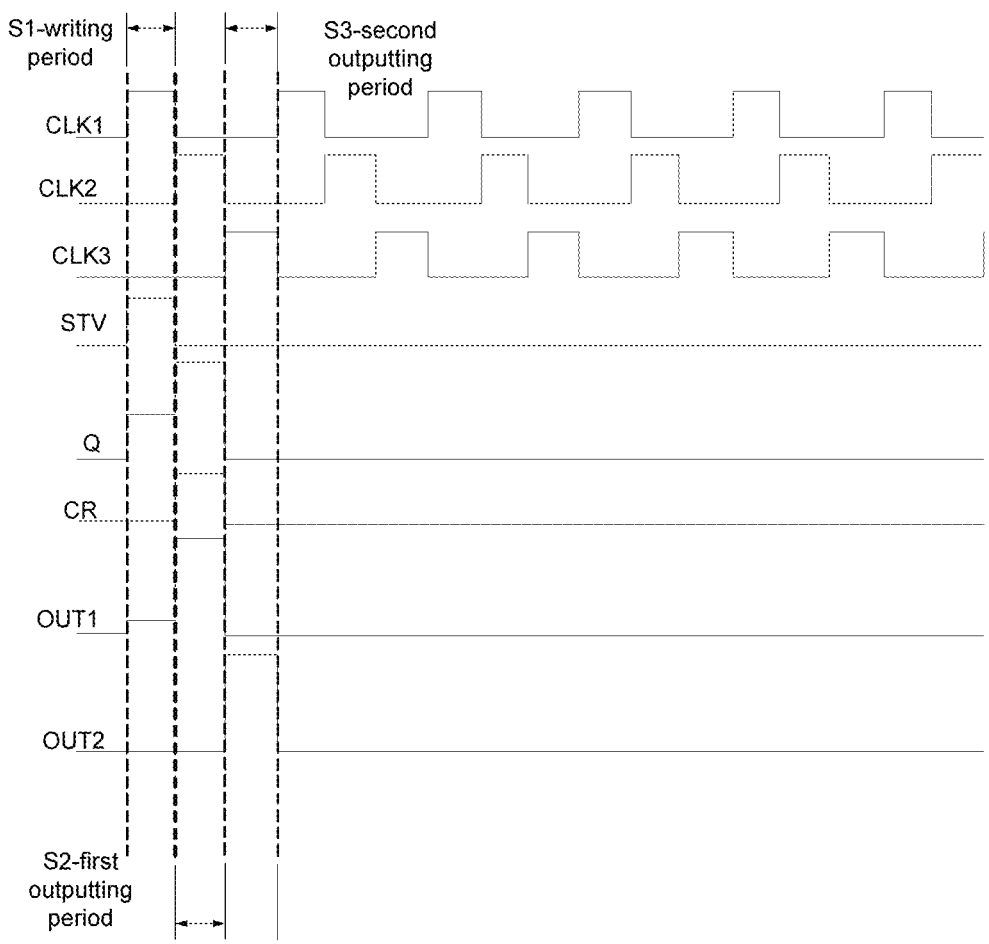
FIG. 4 shows a timing diagram of the method for driving the shift register according to an embodiment of the present disclosure.

FIG. 4 shows a timing diagram of the method for driving the shift register according to an embodiment of the present disclosure. The operation of the shift register according to an embodiment of the present disclosure will be described in detail with reference to FIGS. 2, 3, and 4.

Firstly, during the writing period S1, the first clock signal terminal inputs the high level, the second clock signal terminal inputs the low level, the third clock signal terminal inputs the low level, and the STV signal inputting terminal inputs the high level. The first switch transistor T1 and the second switch transistor T2 are turned on, which results in outputting a high-level signal to the gate of the transistor T5 in the first pulling-up sub-circuit from the outputting terminal of the inputting circuit. Thus, the transistor T5 is turned on, the transistor T13 is turned on, and the second electrode of the transistor T18 is discharged. Thus, the third switch transistor T3, the fourth switch transistor T4, the transistor T11, and the transistor T T12 are all turned off. Since CLK1 is a high level signal, the transistor T14 is turned on, so that the second outputting signal G2_OUT from the second outputting sub-circuit is a low level signal.

Next, during the first outputting period S2, the first clock signal terminal inputs the low level, the second clock signal terminal inputs the high level, and the third clock signal terminal inputs the low level. The first switch transistor T1 and the second switch transistor T2 are turned off. Due to a presence of the first capacitor C1, the leakage limiting transistor T16 is turned on. Thus, the second electrode of the leakage limiting transistor T16 is at a high level. The first switching transistor T1, the second switching transistor T2 and the leakage limiting transistor T16 cooperate with each other, to make the voltage difference between the gate and the source Vgs of the second switching transistor T2 less than zero. Thus, the second switching transistor T2 is turned off, and the potential Q of the gate of T5 in the first pulling-up sub-circuit has a low leakage.

During the first outputting period S2, the third switching transistor T3 and the fourth switching transistor T4 are turned off. The second electrode of the leakage limiting transistor T16 is at a high level. The third switching transistor T3, the fourth switching transistor T4 and the leakage limiting transistor T16 cooperate with each other to make the voltage difference between the gate and the source Vgs of the third switching transistor T3 less than zero. Thus, the third switching transistor T3 is turned off. The potential of the gate Q of the T5 in the first pulling-up sub-circuit has a low leakage. Since the first clock signal CLK 1 is at low level, the sixth switch transistor T6 and the seventh switch transistor T7 are turned off. The sixth switching transistor T6, the seventh switching transistor T7 and the leakage limiting transistor T16 cooperate with each other to make the Vgs of the sixth switching transistor T6 less than zero. Thus, the sixth switching transistor T6 is turned off. The inputting terminal A of the T10 in the second pulling-up sub-circuit has a low leakage.

Since the second clock signal terminal CLK2 is at a high level, the potential of the second electrode CR of the eighth transistor T8 is boosted by coupling with the potential of the gate Q of the eighth transistor T8 via the first capacitor C1. The gate of the eighth transistor T8 is electrically coupled to the gate of the T19 in the first outputting sub-circuit and the gate of the T17 in the switching sub-circuit. After the potential Q is raised, the eighth transistor T8 can be completely turned on, so that the first outputting circuit T10 can output the first outputting signal G1_OUT rapidly.

During the second outputting period S3, the first clock signal terminal inputs the low level, the second clock signal terminal inputs the low level, and the third clock signal terminal inputs the high level. The transistor T10 is turned on. The inputting terminal A of the second pulling-up sub-circuit is at a high level, which results in turning on the ninth transistor T9. Thus, the gate B of the ninth transistor T9 is boosted, and the potential of the second electrode N_3 of the ninth transistor T9 is boosted by coupling with the potential of the gate B of the ninth transistor T9 via the second capacitor C2. After the potential of B is boosted, the ninth transistor T9 can be fully turned on. Thus, the ninth transistor T9 can output the second outputting signal G2_OUT rapidly. Since CLK3 is at a high level, the third switching transistor T3, the fourth switching transistor T4, the fifth switching transistor T5, the transistor T18, and the transistor T13 are simultaneously turned on. The gate of the fifth switching transistor T5 is discharged along a path composed of the third switch transistor T3 and the fourth switch transistor T4. At the same time, the gate of the fifth switch transistor T5 is discharged along the other path composed of the transistor T13 and the transistor T18. Thus, the gate of the transistor T8 in the first pulling-up sub-circuit can be rapidly discharged, thereby pulling-down the potential Q rapidly.

Subsequently, a next driving cycle is arrived. The first clock signal terminal inputs the high level, the second clock signal terminal inputs the low level, the third clock signal terminal inputs the low level, the STV signal inputting terminal inputs the high level, and so on. Thus, this may achieve two outputting signals as shown in FIG. 4.

Figure 5:
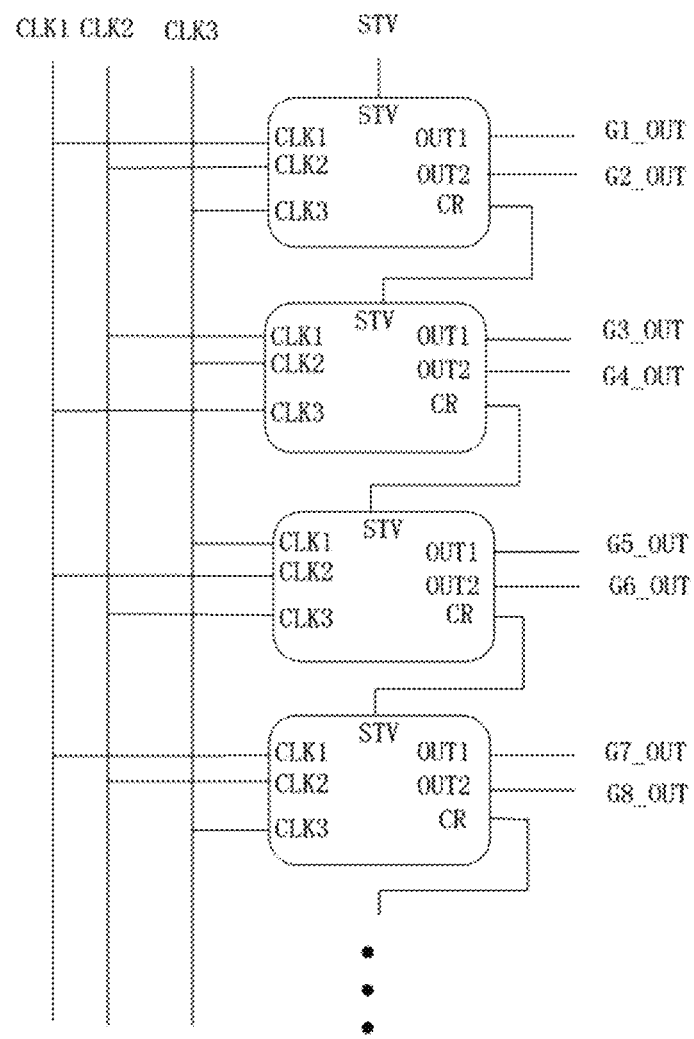
FIG. 5 shows a schematic diagram illustrating a structure of a gate driving circuit according to an embodiment of the present disclosure.

The disclosed embodiments provide a gate driving circuit. FIG. 5 shows a schematic diagram illustrating a structure of a gate driving circuit according to an embodiment of the present disclosure. As shown in FIG. 5, each shift register has a dual outputting circuit. The first outputting sub-circuit and a switching sub-circuit in the first outputting circuit can be turned on at the same time. Thus, while the first outputting sub-circuit outputs a first outputting signal, the switching sub-circuit may take in the first outputting signal from the first outputting sub-circuit and output the first outputting signal as an inputting signal for a second pulling-up sub-circuit in the second outputting circuit. In other words, the first outputting circuit and the second outputting circuit in each shift register may drive two gate lines, so that a two-stage driving for gate lines by using one single shift register can be achieved.

FIG. 5 shows an embodiment of a gate driving circuit provided by the present disclosure. As shown in FIG. 5, the gate driving circuit according to the embodiment of the present disclosure comprises a plurality of cascaded shift registers. Each of the plurality of cascaded shift registers includes an inputting circuit, a first outputting circuit, and a second outputting circuit. The first outputting circuit may comprise a first pulling-up sub-circuit, a first outputting sub-circuit, a first pulling-down sub-circuit, and a switching sub-circuit. An outputting terminal of the inputting circuit is electrically coupled to a gate of the first pulling-up sub-circuit. The first pulling-down sub-circuit is configured to pull down the first outputting signal from the first outputting sub-circuit. A gate of the switching sub-circuit and a gate of the first outputting sub-circuit are controlled by an outputting terminal of the first pulling-up sub-circuit. An inputting terminal of the switching sub-circuit is electrically coupled to an outputting terminal of the first outputting sub-circuit. The second outputting circuit may comprise a second pulling-up sub-circuit, a second outputting sub-circuit, and a second pulling-down sub-circuit. An inputting terminal of the second pulling-up sub-circuit is electrically coupled to an outputting terminal of the switching sub-circuit. A gate of the second outputting sub-circuit is controlled by an outputting terminal of the second pulling-up sub-circuit. An outputting terminal of the second pulling-down sub-circuit is configured to pull down the potential of the second outputting sub-circuit.

The driving signal of a shift register in a next stage may apply the driving signal of the first outputting circuit or the second outputting circuit of the shift register. In the embodiment of the present disclosure, the driving signal of the shift register may use the signal of second electrode CR of the eighth transistor T5 in the shift register in a previous stage. The first outputting circuit or the second outputting circuit of each shift register is not required to be coupled with the shift register in the next stage. Thus, the gate scanning signal outputted from the first outputting circuit or the second outputting circuit will not be affected by the shift register in the next stage. Accordingly, the gate scanning signal from the shift register may be stabilized, and the loss for the gate scanning signal is small.

According to the method for driving a shift register provided in the above embodiment of the present disclosure, since the shift register has a dual outputting circuit. The first outputting sub-circuit and a switching sub-circuit in the first outputting circuit can be turned on at the same time. Thus, while the first outputting sub-circuit outputs a first outputting signal, the switching sub-circuit may output the first outputting signal to the second pulling-up sub-circuit. Since there are three clock signal terminals (the first clock signal terminal, the second clock signal terminal, and the third clock signal terminal), the interference among the individual clock signal terminals can be reduced.

Figure 6:
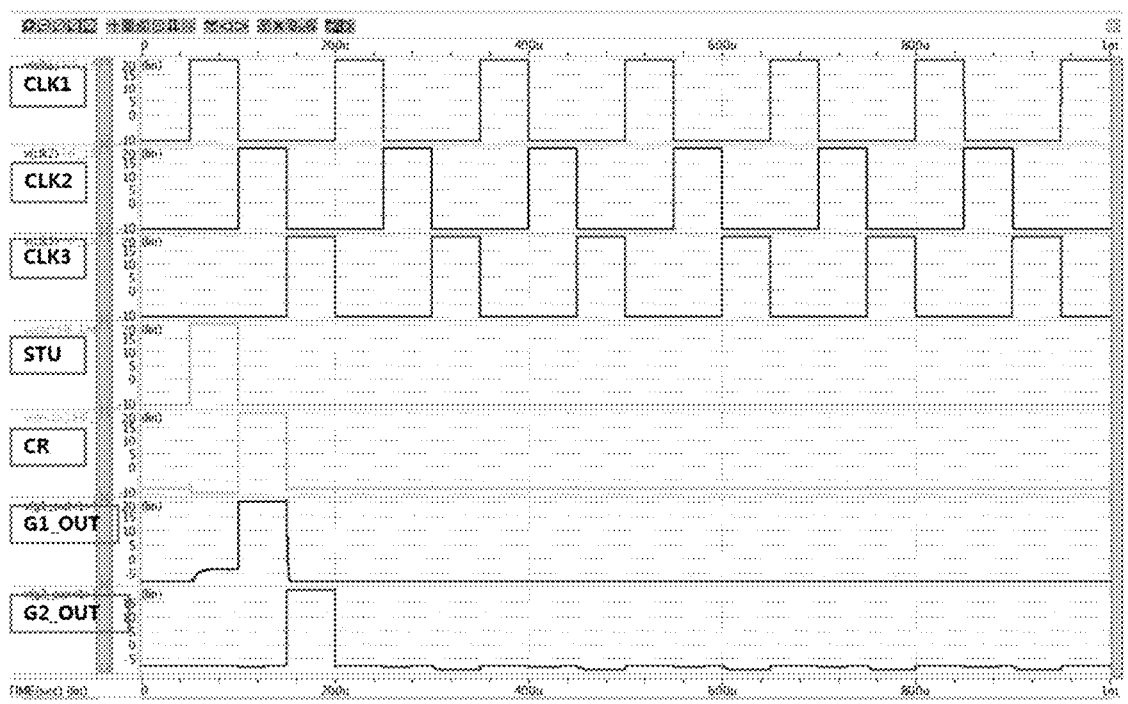
FIG. 6 shows a simulation schematic diagram of a shift register driving circuit according to an embodiment of the present disclosure.

Further, tests are performed on the above embodiments, and a simulation is implemented on a cascaded driving circuit. As shown in FIG. 6, it can be found that the circuit simulation diagram is consistent with the theoretical timing diagram. The signal STV triggers the generation of two-stage outputting signals G1_OUT (the first outputting signal of high level) and G2_OUT (the second outputting signal of high level). It can be seen that the two outputting signals almost both output with a full amplitude, and there is almost no noise when the two outputting signals G1_OUT and G2_OUT are at a low level. Thus, the power consumption is relatively low.

In the above embodiments, the description of each embodiment has its own emphasis. For the part not described in detail in one embodiment, reference may be made to a relevant description of other embodiments.

It can be understood that the related features in the above devices can refer to each other. In addition, "first", "second", and the like in the above embodiments are used to distinguish the embodiments and do not represent the merits of the respective embodiments.

In the description provided herein, a number of specific details are explained. However, it can be understood that embodiments of the present disclosure may be practiced without these specific details. In some instances, well-known structures and techniques have not been shown in detail in order not to obscure the understanding of the description.

Similarly, it should be understood that in order to simplify the disclosure and facilitate in the understanding of one or more aspects of the disclosure, in the description of exemplary embodiments of the disclosure, various features of the disclosure are sometimes grouped together into a single embodiment, diagram, or description. However, the disclosed apparatus should not be interpreted as if the claimed invention requires more features than those specifically recited in each claim. Rather, as reflected by the following claims, the claimed invention lie in being less than all features recited in one single embodiment disclosed above. Thus, the claims following the detailed description are hereby expressly incorporated into this detailed description, with each claim standing on its own as a separate embodiment of this disclosure.

Those skilled in the art can understand that the components in the apparatus of the embodiment can be adaptively changed and disposed in one or more apparatuses different from this embodiment. The components in the embodiments can be combined into one component, and moreover, they can be divided into a plurality of sub-components. All features disclosed in this specification (including accompanying claims, abstracts, and figures) and all components of the apparatus as disclosed may be combined in any form, unless at least some of such features are conflicted. Each feature disclosed in this specification (including accompanying claims, abstract, and drawings) may be replaced by any other feature that provides the same, equivalent, or similar function, unless otherwise stated.

In addition, those skilled in the art can understand that although some embodiments described herein include some features described in other embodiments rather than other features, the combination of features of different embodiments is meant to be within the scope of the present disclosure and form different embodiments. For example, in the following claims, any of the claimed embodiments can be combined in any form. Various components according to the embodiments of the present disclosure may be implemented in hardware, software or in combinations thereof.

It should be noted that the above-mentioned embodiments illustrate the present disclosure and do not limit the disclosure, and that those skilled in the art can design alternative embodiments without departing from the scope of the appended claims. In the claims, any reference numbers placed between parentheses shall not be construed as limiting the claims. The word "comprising" does not exclude the presence of elements or components not listed in the claims. The word "a" or "an" preceding an element or a component does not exclude the presence of a plurality of such elements or components. The present disclosure may be implemented with a device including several different components. In the claims where several components are listed, these several components may be embodied by the same component. The use of the word such as "first", "second", "third", etc. do not indicate any order. These words can be interpreted as names.

The above description is merely an embodiment of the present disclosure and does not limit the present disclosure in any form. Any simple modifications, equivalent variations and modifications made to the above embodiments according to the technical essence of the present disclosure are still within the scope of the present disclosure.

We claim:

1. A shift register, comprising:

an inputting circuit;

a first outputting circuit, comprising a first pulling-up sub-circuit, a first outputting sub-circuit, a first pulling-down sub-circuit, and a switching sub-circuit; wherein an outputting terminal of the inputting circuit is electrically coupled to a controlling terminal of the first pulling-up sub-circuit, an outputting terminal of the first pulling-up sub-circuit is electrically coupled to a controlling terminal of the switching sub-circuit and a controlling terminal of the first outputting sub-circuit; an inputting terminal of the switching sub-circuit is electrically coupled to an outputting terminal of the first outputting sub-circuit; and an outputting terminal of the first pulling-down sub-circuit is electrically coupled to the outputting terminal of the first outputting sub-circuit; and a second outputting circuit, comprising a second pulling-up sub-circuit, a second outputting sub-circuit, and a second pulling-down sub-circuit; wherein an inputting terminal of the second pulling-up sub-circuit is electrically coupled to an outputting terminal of the switching sub-circuit, a controlling terminal of the second outputting sub-circuit is electrically coupled to an outputting terminal of the second pulling-up sub-circuit, and an outputting terminal of the second outputting sub-circuit is electrically coupled to an outputting terminal of the second pulling-down sub-circuit;

wherein a controlling terminal of the inputting circuit is electrically coupled to a first clock signal terminal, and an inputting terminal of the inputting circuit is electrically coupled to an STV signal inputting terminal, and wherein an inputting terminal of the first pulling-up sub-circuit is electrically coupled to a second clock signal terminal;

wherein a controlling terminal of the first pulling-down sub-circuit is electrically coupled to a third clock signal terminal;

wherein a controlling terminal of the second pulling-up sub-circuit is electrically coupled to if the third clock signal terminal, and wherein a controlling terminal of the second pulling-down sub-circuit is electrically coupled to the first clock signal terminal.

2. The shift register of claim 1, wherein the inputting circuit comprises a first switch transistor and a second switch transistor, wherein the first switch transistor has a first electrode electrically coupled to the STV signal inputting terminal and a second electrode electrically coupled to a first electrode of the second switch transistor; the second switch transistor has a second electrode electrically coupled to the controlling terminal of the first pulling-up sub-circuit, the controlling terminal of the switching sub-circuit and the controlling terminal of the first outputting sub-circuit; and both of the first switch transistor and the second switch transistor have a gate electrically coupled to the first clock signal terminal; and a leakage limiting transistor, wherein the leakage limiting transistor has a gate electrically coupled to the controlling terminal of the first pulling-up sub-circuit, a first electrode electrically coupled to the second electrode of the first switch transistor, and a second electrode electrically coupled to the second clock signal terminal.

3. The shift register of claim 2, wherein the first pulling-down sub-circuit comprises a third switch transistor and a fourth switch transistor, wherein both of the third switch transistor and the fourth switch transistor have a gate controlled by the third clock signal terminal; and the third switch transistor has a first electrode electrically coupled to the gate of the leakage limiting transistor and a second electrode electrically coupled to a first electrode of the fourth switch transistor, and the fourth switch transistor has a second electrode electrically coupled to a low level power supplying terminal.

4. The shift register of claim 2, wherein the first pulling-down sub-circuit comprises a fifth switch transistor; and wherein the fifth switch transistor has a first electrode electrically coupled to the low level power supplying terminal, a second electrode electrically coupled to the controlling terminal of the first pulling-up sub-circuit, and a gate electrically coupled to the third clock signal terminal.

5. The shift register of claim 2, wherein the second pulling-down sub-circuit comprises a sixth switch transistor and a seventh switch transistor; and wherein both of the sixth switch transistor and the seventh transistor have a gate electrically coupled to the first clock signal terminal, the sixth switch transistor has a first electrode electrically coupled to the inputting terminal of the second pulling-up sub-circuit and a second terminal electrically coupled to a first electrode of the seventh switch transistor, and the seventh switch transistor has a second electrode electrically coupled to the low level power supplying terminal; and wherein the leakage limiting transistor has a first electrode electrically coupled to the second electrode of the sixth switch transistor.

6. The shift register of claim 1, wherein the first pulling-up sub-circuit comprises an eighth transistor and a first capacitor, and wherein the eighth transistor has a gate electrically coupled to the outputting terminal of the inputting circuit, a first electrode electrically coupled to the second clock signal terminal, and a second electrode electrically coupled to a first electrode of the first capacitor, and wherein the first capacitor has a second electrode electrically coupled to the gate of the eighth transistor.

7. The shift register of claim 1, wherein the second outputting sub-circuit comprises a ninth transistor and a second capacitor; and wherein the ninth transistor has a gate electrically coupled to a first electrode of the second capacitor, a first electrode electrically coupled to a high level power supplying terminal, and a second electrode electrically coupled to a second electrode of the second capacitor.

8. A gate driving circuit, comprising a plurality of cascaded shift registers, wherein each of the plurality of cascaded shift registers is the shift register of claim 1.

9. A method for driving a shift register of claim 1, comprising:

inputting a first clock signal of high level into the first clock signal terminal, a second clock signal of low level into the second clock signal terminal, a third clock signal of low level into the third clock signal terminal, and an STV signal of high level to the STV signal inputting terminal, so that a high level signal is outputted to the controlling terminal of the first pulling-up sub-circuit from the outputting terminal of the inputting circuit, and a potential of a second outputting signal from the second outputting sub-circuit is pulled-down by the second pulling-down sub-circuit under the control of the first clock signal, during a writing period;

inputting the first clock signal of low level to the first clock signal terminal, the second clock signal of high level to the second clock signal terminal, and the third clock signal of low level to the third clock signal terminal, so that the outputting terminal of the first pulling-up sub-circuit outputs a high level signal, and the first outputting sub-circuit outputs a first outputting signal under the control of the high level signal from the first pulling-up sub-circuit, and the switching sub-circuit receives the first outputting signal and outputs the received first outputting signal to the inputting terminal of the second pulling-up sub-circuit, during a first outputting period; and inputting the first clock signal of low level to the first clock signal terminal, the second clock signal of low level to the second clock signal terminal, and the third clock signal of high level to the third clock signal terminal, so that the outputting terminal of the second pulling-up sub-circuit outputs the first outputting signal, and the second outputting sub-circuit outputs a second outputting signal under the control of the first outputting signal, and the first pulling-down sub-circuit pulls-down the potential of the first outputting signal, during a second outputting period.

* * * * *